United States Patent [19]
Jewell et al.

[11] Patent Number: 5,245,622
[45] Date of Patent: Sep. 14, 1993

[54] VERTICAL-CAVITY SURFACE-EMITTING LASERS WITH INTRA-CAVITY STRUCTURES

[75] Inventors: Jack L. Jewell; Gregory Olbright, both of Boulder, Colo.

[73] Assignee: Bandgap Technology Corporation, Broomfield, Colo.

[21] Appl. No.: 879,471

[22] Filed: May 7, 1992

[51] Int. Cl.$^5$ ............................................... H01S 3/19
[52] U.S. Cl. ........................................ 372/45; 372/46; 372/96
[58] Field of Search .......................... 372/43, 46, 96, 49

[56] References Cited

U.S. PATENT DOCUMENTS

| | | | |
|---|---|---|---|
| 4,873,696 | 10/1989 | Coldren et al. | 372/96 |
| 4,901,327 | 2/1990 | Bradley | 372/45 |
| 4,943,970 | 7/1990 | Bradley | 372/45 |
| 4,949,350 | 8/1990 | Jewell et al. | 372/45 |
| 4,949,351 | 8/1990 | Imanaka | 372/45 |
| 4,991,179 | 2/1991 | Deppe et al. | 372/45 |
| 4,999,842 | 3/1991 | Huang et al. | 372/45 |
| 5,034,344 | 7/1991 | Jewell et al. | 437/129 |
| 5,034,958 | 7/1991 | Kwon et al. | 372/45 |
| 5,052,016 | 9/1991 | Mahbobzadeh et al. | 372/96 |
| 5,056,098 | 10/1991 | Anthony et al. | 372/45 |
| 5,063,569 | 11/1991 | Xie | 372/45 |
| 5,115,441 | 5/1992 | Kopf et al. | 372/45 |
| 5,115,442 | 5/1992 | Lee et al. | 372/45 |

OTHER PUBLICATIONS

Jewell et al., "Vertical Cavity Single Quantum Well Laser", *Appl. Phys. Lett.*, vol. 55, Jul., 1989, pp. 424-426.

Lee et al., "Top-Surface-Emitting GaAs Four-Quantum-Well Lasers Emitting at 0.85 μm,"0 *Electronic Letters*, vol. 26, May, 1990, pp. 710-711.

Yoo et al., "Low Series Resistance Vertical-Cavity Front-Surface-Emitting Laser Diode," *Appl. Phys. Letters*, vol. 56, No. 20, May, 1990, pp. 1942-1945.

Hasnain et al., "Continuous Wave Top Surface Emitting Quantum Well Lasers Using Hybrid Metal/Semiconductor Reflectors," *Electronic Letters*, vol. 26, Sep., 1990, pp. 1590-1592.

Hasnain et al., "High Temperature and High Frequency Performance of Gain-Guided Surface Emitting Lasers," *Electronic Letters*, vol. 27, No. 11, May 1991, pp. 915-916.

Jewell et al., "Vertical-Cavity Surface Emitting Lasers: Design Growth, Fabrication, Characterization," *IEEE Journal of Quantum Electronics*, vol. 27, No. 6, Jun. 1991, pp. 1332-1346.

Jewell et al., "Microlasers," *Scientific American*, vol. 265, No. 5, Nov., 1991, pp. 86-96.

*Primary Examiner*—Georgia Y. Epps
*Attorney, Agent, or Firm*—Pennie & Edmonds

[57] ABSTRACT

Vertical-cavity surface-emitting lasers (VCSELs) are disclosed having various intra-cavity structures to achieve low series resistance, high power efficiencies, and TEM$_{00}$ mode radiation. In one embodiment of the invention, a VCSEL comprises a laser cavity disposed between an upper and a lower mirror. The laser cavity comprises upper and lower spacer layers sandwiching an active region. A stratified electrode for conducting electrical current to the active region is disposed between the upper mirror and the upper spacer. The stratified electrode comprises a plurality of alternating high and low doped layers for achieving low series resistance without increasing the optical absorption. The VCSEL further comprises a current aperture as a disk shaped region formed in the stratified electrode for suppressing higher mode radiation. The current aperture is formed by reducing or eliminating the conductivity of the annular surrounding regions. In another embodiment, a metal contact layer having an optical aperture is formed within the upper mirror of the VCSEL. The optical aperture blocks the optical field in such a manner that it eliminates higher transverse mode lasing.

38 Claims, 12 Drawing Sheets

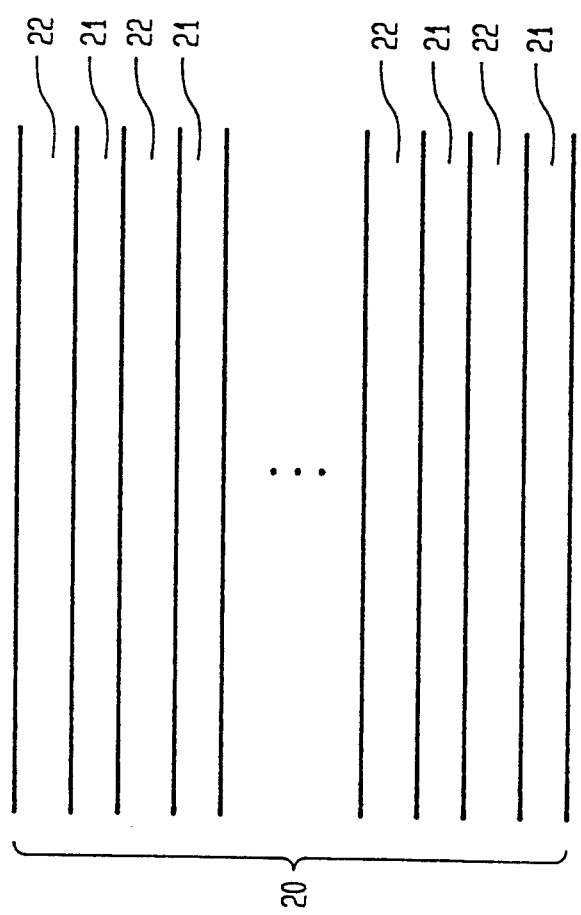

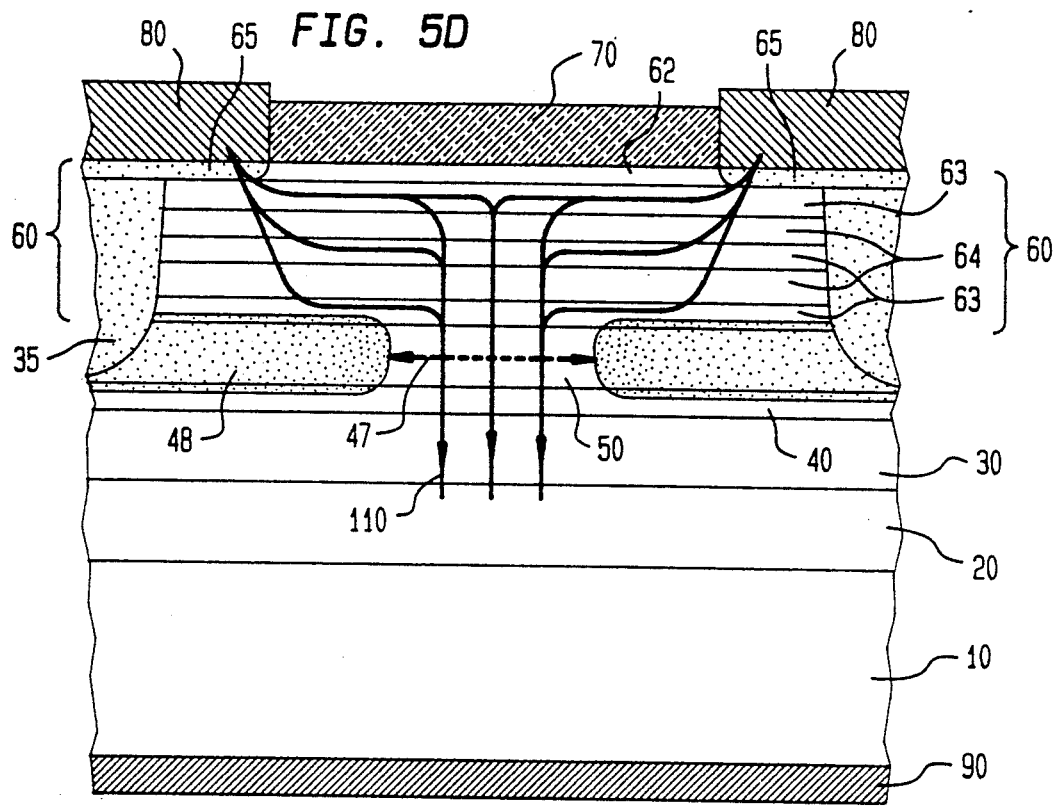
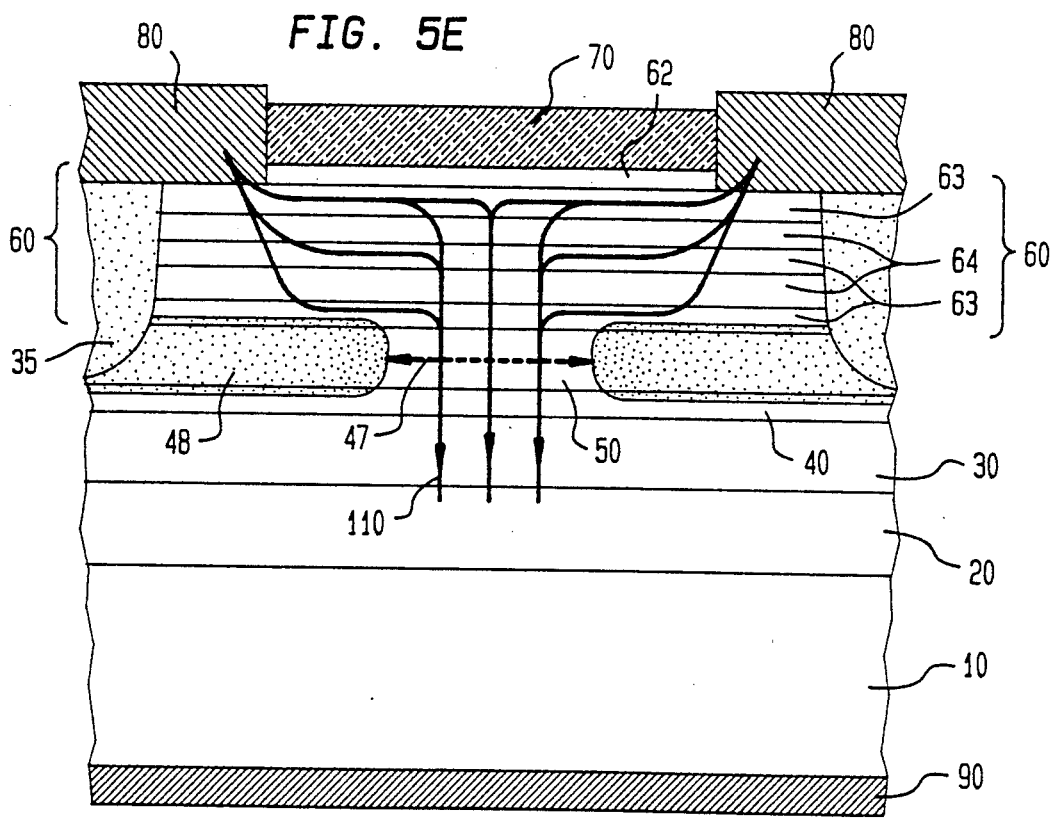

VERTICAL-CAVITY SURFACE-EMITTING LASERS WITH INTRA-CAVITY STRUCTURES

CROSS-REFERENCE TO RELATED APPLICATION

This application is related to our copending application Ser. No. 07/790,964, filed Nov. 7, 1991, for "Visible Light Surface Emitting Semiconductor Laser," which is incorporated herein by reference.

FIELD OF THE INVENTION

This invention relates to semiconductor lasers and, more particularly, to vertical-cavity surface-emitting lasers that utilize intra-cavity structures to achieve low series resistance, high power efficiency, and single transverse mode operation.

BACKGROUND OF THE INVENTION

Vertical-cavity surface-emitting lasers (VCSELs) emit radiation in a direction perpendicular to the plane of the p-n junction or substrate rather than parallel to the plane of the p-n junction as in the case of conventional edge-emitting diode lasers. In contrast to the astigmatic beam quality of conventional edge emitting lasers, VCSELs advantageously emit a circularly symmetric Gaussian beam and thus do not require anamorphic correction. VCSELs, moreover, can readily be made into two-dimensional laser arrays as well as be fabricated in extremely small sizes. Accordingly, two-dimensional VCSEL arrays have various applications in the fields of optical interconnection, integrated optoelectronic circuits and optical computing.

To achieve a low threshold current, VCSELs typically utilize a thin active region on the order of $\lambda/4n$ thick or less, where $\lambda$ is the wavelength of the emitted light and n is the index of refraction of the active region. With such a thin active region, however, VCSELs have a single pass optical gain of approximately 1% or less, thereby requiring the use of end mirrors having reflectivities greater than 99% to achieve lasing. Such a high reflectivity is normally achieved by employing epitaxially grown semiconductor distributed Bragg reflector (DBR) mirrors.

DBR mirrors comprise alternating high and low index of refraction semiconductor layers. For a reflectivity greater than 99%, between 20-30 pairs of such alternating semiconductor layers is typically needed, depending on the difference between the refractive indices of the layers. Doped with the appropriate dopants to have opposite conductivity types, the DBR mirrors form with the active region a p-i-n structure. Current injection is facilitated by making electrical contacts to each DBR mirror such that electrons and holes traverse through the mirrors to reach the active region, where they combine and generate radiation.

Unfortunately, the VCSEL's applicability is severely limited by its low optical power output. Particularly, VCSELs have not been able to achieve comparable optical power output levels as those of edge-emitting lasers. The total power efficiency of VCSELs is presently limited to less than approximately 10%, whereas edge-emitting lasers routinely exhibit power efficiencies over 50%.

The VCSEL's low power efficiency results from two contributing factors: (1) low electrical conductivity, and (2) low optical quantum efficiency. The low-electrical conductivity is caused by the small cross-sectional area of the active region, i.e., small conduction area, and the high resistance associated with electron and hole transport perpendicularly through the multilayered DBR mirrors. The optical quantum efficiency of the VCSELs, however, is related to the optical field overlap with absorptive material within the laser cavity.

To date, all demonstrated designs of VCSELs have compromised between their optical and electronic characteristics. Designs that optimize optical quantum efficiency minimize electrical conductivity, and vice versa.

In a recent effort to address the high series resistance problem, Kwon et al. in U.S. Pat. No. 5,034,958 entitled "Front-Surface Emitting Diode" describe a VCSEL comprising a laser cavity disposed between upper and lower mirrors, with an active region sandwiched between upper and lower spacers. The lower mirror includes a semiconductor DBR, whereas the upper mirror includes a dielectric DBR. An electrical contact layer comprising one or two pairs of p-type doped GaAs/AlAs semiconductor layers which form a semiconductor DBR is disposed between the upper dielectric mirror and the upper spacer for injecting current into an upper portion of the active region.

The VCSEL design of Kwon et al. further comprises a contact region defined by implanting conductivity increasing ions into the region surrounding the cavity between the active layer and upper mirror. In this structure, electrical current only travels through one or two pairs of GaAs/AlAs semiconductor layers to reach the upper spacer and then the active region, instead of the typical 20–30 pairs in conventional VCSELs. Consequently, the series resistance for this VCSEL structure is reduced.

Despite this improved design, in comparison to edge emitting lasers, the series resistance is still high, limiting its performance. Although increasing the doping concentration in these layers, for example, from the typical $10^{18}/cm^3$ to $10^{20}/cm^3$ or $10^{21}/cm^3$, would further reduce the series resistance, such doping concentrations prohibitively increase optical absorption, reduce quantum efficiency and compromise power performance.

Another problem associated with prior art VCSELs is that they tend to lase in higher-order transverse modes, whereas single transverse mode $TEM_{00}$ lasing is typically preferred.

Therefore, it is an object of this invention to reduce the series resistance of VCSELs without substantially compromising their optical quantum efficiency so as to improve their power efficiency.

It is another object of this invention to suppress higher-order transverse mode lasing within VCSELs.

SUMMARY OF THE INVENTION

These and other objects are achieved in accordance with the invention in vertical-cavity surface-emitting lasers (VCSELs) that utilize intra-cavity structures to reduce the series resistance and achieve single transverse mode $TEM_{00}$ operation. The intra-cavity structures include a stratified electrode, a stratified electrode with a current aperture, and/or an optical aperture.

In one preferred embodiment of the invention, a VCSEL comprises a laser cavity disposed between upper and lower distributed Bragg reflector (DBR) mirrors. The laser cavity comprises upper and lower spacers surrounding an active region that generates optical radiation. A stratified electrode is disposed between the upper mirror and the upper spacer for conducting electrical current into the active region to cause lasing. Alternatively, the stratified electrode can also be disposed within the upper mirror, preferably below most of the upper mirror.

The stratified electrode comprises a plurality of alternating high and low doped semiconductor layers of the same conductivity type, vertically stacked with respect to the active region. During lasing, a standing wave with periodic intensity maxima and minima is established in the laser cavity. The high doped layers of the stratified electrode are positioned near the standing wave minima, separated by the low doped layers positioned near standing wave maxima. This arrangement produces a high transverse conductance in the stratified electrode without substantially increasing optical absorption and, as a result, greatly reduces the series resistance without compromising the optical efficiency.

In another embodiment, in combination with the stratified electrode, an electrical current aperture having a diameter smaller than the laser cavity optical aperture is used to suppress higher-order transverse mode lasing. This current aperture substantially reduces current crowding at the peripheral portion of the active region, and increases electrical current density at the center of the active region. As a result, higher-order transverse mode lasing is eliminated.

The electrical current aperture is a disk shaped region horizontally located between the upper mirror and the active region. It is defined by an ion implantation of conductivity reducing ions into the annular surrounding area. The electrical current aperture is vertically aligned to the center of the upper mirror, and has a diameter equal to or smaller than that of the upper mirror. The implanted area that defines the current aperture has a conductivity reducing ion concentration such that, in the implanted area, the low doped p layers have a high resistivity while the high doped p+ layers remain conductive. Therefore, when electrical current is applied to the stratified electrode, it flows substantially parallel to the active region until it reaches the current aperture where it is then vertically and uniformly injected into the active region. In this manner, single transverse mode $TEM_{00}$ operation is achieved.

In another embodiment of the invention, a VCSEL comprises a laser cavity disposed between upper and lower DBR mirrors. The laser cavity comprises upper and lower spacers surrounding an active region. The upper and lower mirrors are DBRs which comprise sequential pairs of high and low index of refraction layers. The active region is further defined as having a gain region defined within the active region by an ion implantation of the annular surrounding area with conductivity reducing ions. A metal layer lying in a plane parallel to the active region is formed within the upper DBR mirror. Preferably, the metal layer is placed within only a few layers of the layers that form the upper DBR mirror above a top portion of the spacer. The metal layer has an opening which is vertically aligned to the gain region and has a diameter equal or smaller than that of the gain region. This opening functions as an optical aperture that blocks the optical field in such a fashion as to eliminate higher-order transverse-mode operation, resulting in single transverse mode $TEM_{00}$ operation. In addition, the metal layer functions as a buried ohmic-metal contact, thereby reducing the series resistance by reducing the number of electrically resistive layers through which carriers transverse to reach the active region.

BRIEF DESCRIPTION OF THE DRAWING

These and other features, objects, and advantages of the present invention will become more apparent from the detailed description in conjunction with the appended drawings in which:

FIG. 4 is an enlarged cross-section of a lower mirror shown in FIG. 3;

FIG. 5(d) is a modified structure of FIG. 3 utilizing a shallow implantation to reduce contact resistance;

FIG. 5(e) is another modified structure of FIG. 3 utilizing an etched mesa to reduce contact resistance;

DETAILED DESCRIPTION

The present invention relates to vertical-cavity surface-emitting lasers (VCSELs) having intra-cavity structures. The intra-cavity structures include a stratified electrode, a stratified electrode with a current aperture, and/or an optical aperture. These VCSELs with the above intra-cavity structures have drastically reduced series resistance, significantly improved power efficiency and single transverse mode $TEM_{00}$ operation.

In FIGS. 1-10, illustrative views of various VCSEL structures in accordance with principles of the invention are shown. For convenience of reference, in the above figures, like elements have been given the same reference designation.

Figure 1:
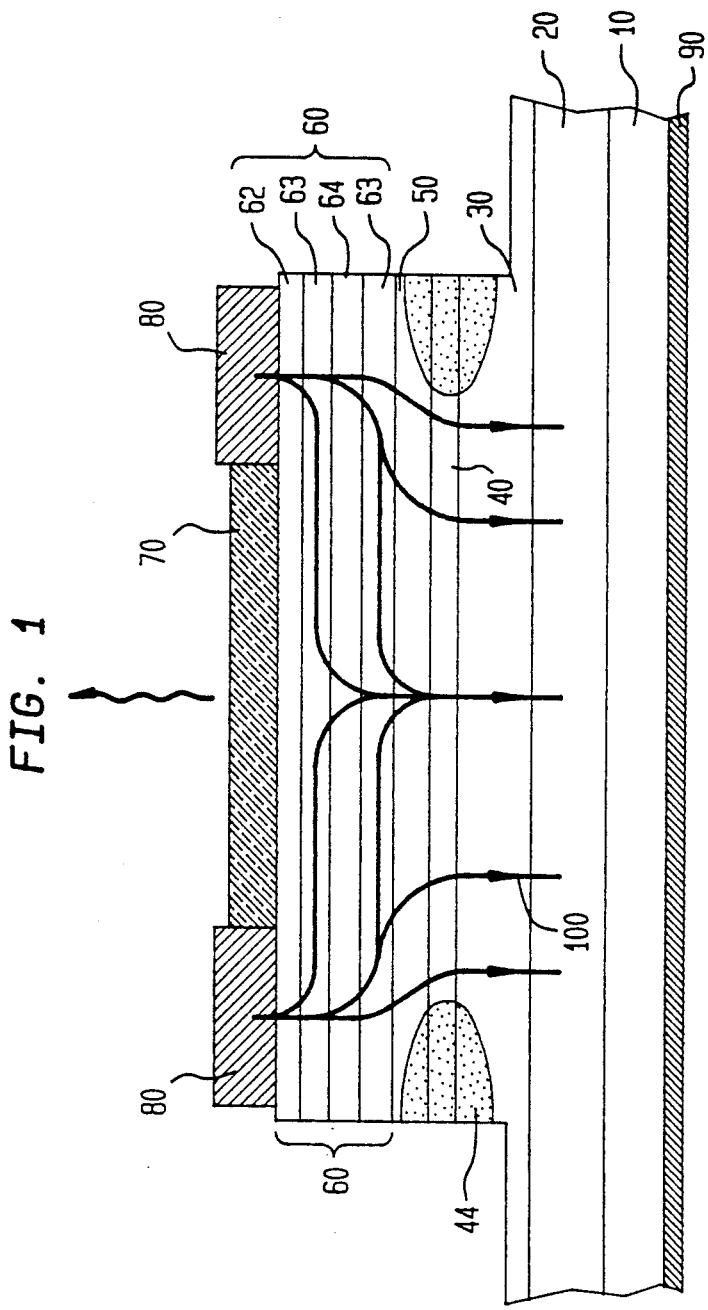
FIG. 1 is a cross-section of a VCSEL with an intra-cavity first stratified electrode in accordance with the invention.
Figure 2:
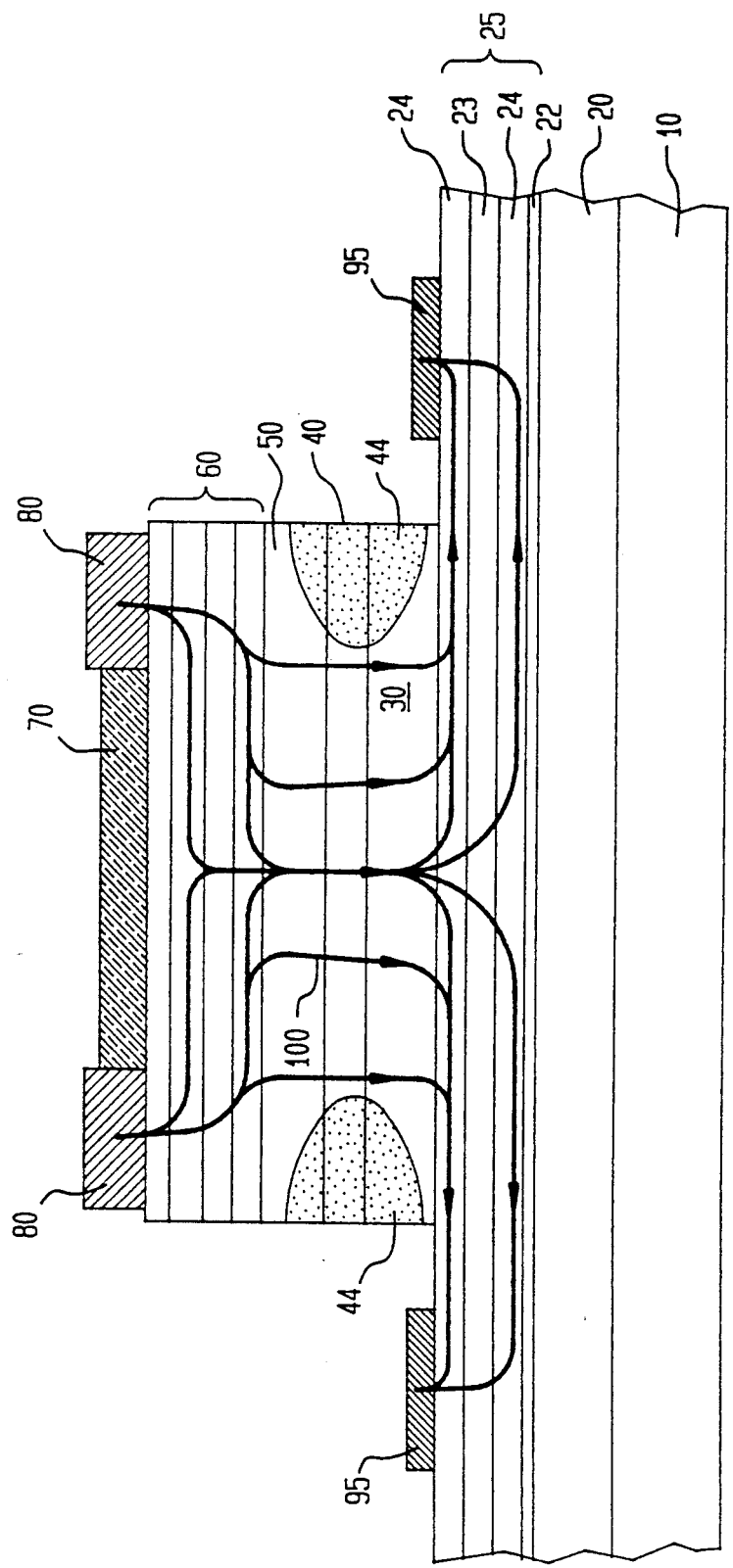
FIG. 2 is a cross-section of a VCSEL with intra-cavity first and second stratified electrodes.

Shown in FIG. 1 is a VCSEL with a stratified electrode in accordance with the invention. The VCSEL comprises a lower mirror 20, a lower spacer 30, an stratified electrode 60, and an upper mirror 70. Following techniques known in the art and described, for example, in U.S. Pat. No. 4,949,350 entitled "Surface Emitting Semiconductor Laser," layers 20, 30, 40, 50 are epitaxially formed on a substrate 10. First stratified electrode 60 is also epitaxially formed on upper spacer

50. Two electrical contacts, a top electrical contact 80 for electrically contacting first stratified electrode 60 and a bottom electrical contact 90 for electrically contacting substrate 10, are also constructed.

Electrical current passes from electrical contact 80 to first stratified electrode 60, then to spacer 50, active region 40, spacer 30, mirror 20, substrate 10 and finally to bottom electrical contact 90. Since electrical current is conducted through the stratified electrode into the active region, upper mirror 70 does not need to be conductive. Advantageously, this allows the VCSEL to utilize an upper dielectric DBR mirror. Dielectric layers can be fabricated to have a larger difference in refractive index than semiconductor layers. As a result, fewer dielectric layers are required to form an effective DBR mirror, for example, 4 or 5 pairs instead of the 20 to 30 pairs for semiconductor layers. This eliminates the time consuming process of epitaxially growing an upper semiconductor DBR mirror and yields a more planar VCSEL.

First stratified electrode 60 comprises two high doped layers 63 and two low doped layers 62, 64. Layers 62, 63, and 64 have the same conductivity type of dopants as upper spacer 50, so as to conduct electrical current to active region 40. A current blocking region 44, formed by an annular proton implantation into the active region, is utilized to horizontally confine the electrical current. Electrical current, as indicated by solid arrows 100, flows horizontally and then vertically into the active region to cause optical radiation. As illustrated in FIG. 1, due to the high conductivity in the high doped layers, there is substantial lateral current flow in high doped layers 63.

Figure 3:
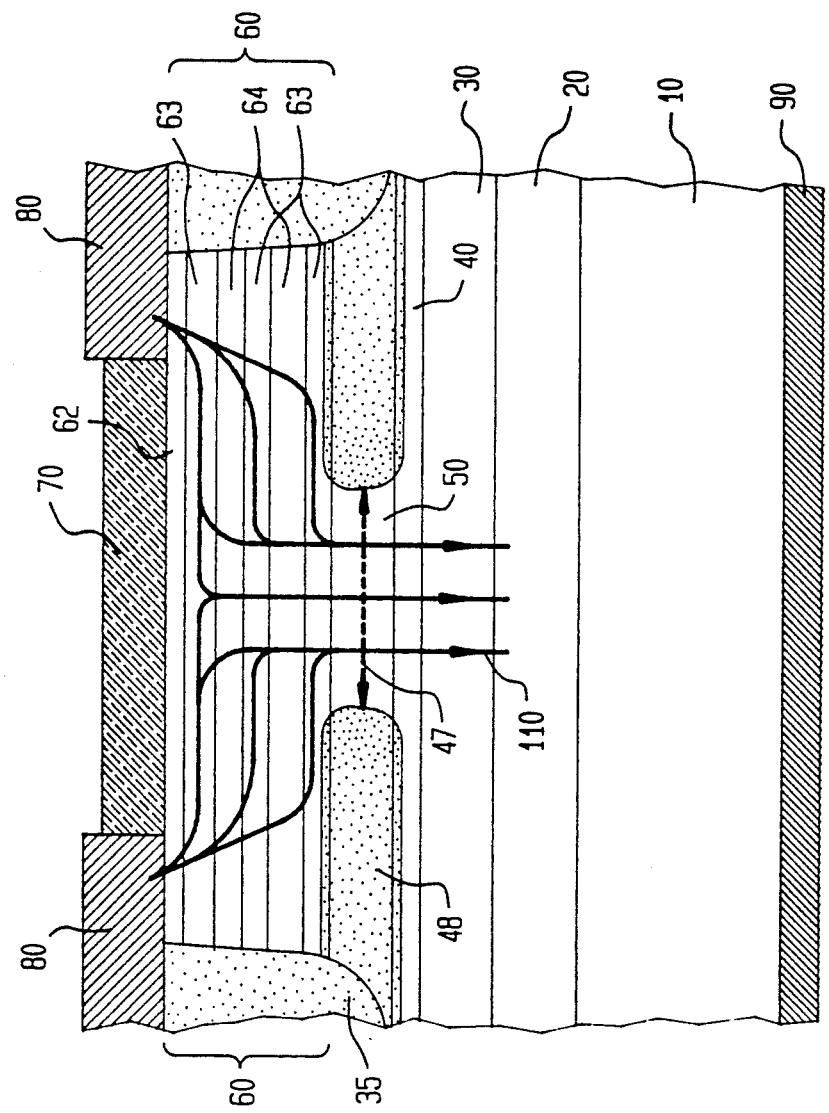
FIG. 3 is a cross-section of a VCSEL with an intra-cavity stratified electrode and current aperture.

An embodiment which also utilizes a second stratified electrode is shown in FIG. 3. A second stratified electrode 25 is disposed between lower spacer 30 and lower mirror 20. The second stratified electrode comprises two high doped layers 24 and two low doped layers 22, 23. Layers 22, 23, 24 have the same conductivity type dopants as lower spacer 30, but have the opposite conductivity type dopants as first stratified electrode 60. An electrical contact 95 is constructed and electrically connected to second stratified electrode 25. Alternatively, electrical contact 95 could also be constructed indentically to electrical contact 90 of FIG. 1.

The series resistance and optical absorption of the VCSEL are further reduced by the use of second stratified electrode 25. Advantageously, it also allows epitaxially grown semiconductor lower mirror 20 to be undoped, thereby reducing light absorption in the lower mirror. A major advantage in utilizing electrical contact 95 is that substrate 10 can be made of a semi-insulating material, such as, for example, semi-insulating GaAs. Those applications requiring the monolithic integration of VCSELs with other electronic or electro-optical devices to form optoelectronic integrated circuits greatly benefit from the use of semi-insulating materials. Also, high speed or high frequency applications will benefit from the use of a semi-insulating substrate.

The above VCSEL structures are readily integrated, for example, with heterojunction bipolar transistors (HBTs), heterojunction field effect transistors (HFETs), heterojunction phototransistors (HPTs), and photodetectors in a manner similar to that disclosed in our co-pending application Ser. No. 07/823,496 entitled "Integration of Transistors With Vertical Cavity Surface Emitting Lasers" filed on Jan. 21, 1992, which is incorporated herein by reference. Such integration is contemplated in the practice of the invention.

In another embodiment, a VCSEL with a stratified electrode and an ion-implanted electrical current aperture, as shown in FIG. 4, is utilized as one means to substantially eliminate higher transverse mode lasing. Higher transverse mode lasing is mainly due to two factors: (1) the current often flows at higher density in the outer part of the active layer due to low resistance; and (2) the gain in the central portion of the active layer is quickly bleached by the lowest-order mode and cannot be replenished fast enough due to the lack of good transverse conductivity in the active region. A stratified electrode with an intra-cavity current aperture provides good transverse conductance and uniform current injection into the active region so as to substantially eliminate higher transverse mode lasing.

The fabrication process of this device begins with a n+ doped GaAs substrate 10, followed by the sequential epitaxial growth of lower semiconductor DBR mirror 20, lower spacer 30, active region 40, upper spacer 50, and stratified electrode 60. Two proton implanted regions, a deep implanted region 48 for defining a current aperture 47, and a shallow implanted region 35 for isolating the device from other devices on the same substrate, are formed by well known implantation techniques. The device is further thermally annealed at a high temperature to reduce damage caused by the implantation.

Top ohmic contact 80 for contacting the stratified electrode is formed by photolithography and metallic deposition. Upper dielectric mirror 70 is then deposited and defined by photolithography and dielectric deposition. Substrate 10 is then lapped down to a desired thickness before forming a back ohmic contact 90 for contacting the n+ doped GaAs substrate.

Current aperture 47 is defined by annular shaped proton implanted region 48. Advantageously, current aperture 47 is designed to have a smaller diameter than upper mirror 70. In forming the aperture, the implantation energy is judiciously chosen such that the implanted protons are substantially vertically confined in stratified electrode 60 and upper spacer 50. Also, the implantation proton concentration is chosen such that, in the implanted region, the p-type low doped layers become highly resistive whereas the p+-type high doped layers remain conductive. This configuration confines electrical current 110, as indicated by the solid arrow, to flow vertically and uniformly into the active region, diminishing current crowding at the periphery of the active region and resulting in single transverse mode $TEM_{00}$ operation. Similarly, current aperture 47 can also be combined with second stratified layer 25 and/or electrical contact 95 of FIG. 2.

As shown in FIG. 4, lower mirror 20 comprises alternating layers 21, 22 of n+ doped AlAs and AlGaAs, respectively. Each layer is a $\lambda/4$ thick, where $\lambda$ is the wavelength of the emitted radiation. For a detailed description of the epitaxial growth of semiconductor DBR mirrors, see, for example, J. Jewell et al., "Vertical-Cavity Surface-Emitting Lasers: Design, Growth Fabrication, Characterization," IEEE *Journal of Quantum Electronics*, Vol. 27, No. 6, pp. 1332–1346 (June 1991), which is incorporated herein by reference.

As shown in FIG. 5(*a*), an optical cavity sandwiched by upper and lower mirrors comprises lower spacers 30, active region 40, upper spacer 50, and stratified electrode 60. Stratified electrode 60 comprises p-type high doped AlGaAs layers 63 and low doped InGaP layers 62 and 64. In the stratified electrode, high doped layer 63, has a thickness equal to or less than $\lambda/4n$, low doped layer 64 has a thickness equal to or greater than $\lambda/4n$, and the sum of the thickness of layer 63 and layer 64 being substantially $\lambda/2n$ where n is the index of refraction of the respective layers. Low doped layer 62 has a thickness of $\lambda/8n$. The p-type doping concentrations of the high and low doped layers are approximately $10^{20}/cm^3$ and $10^{18}/cm^3$, respectively. With such a high doping concentration, high doped layers 63 become very conductive.

Figure 5A:
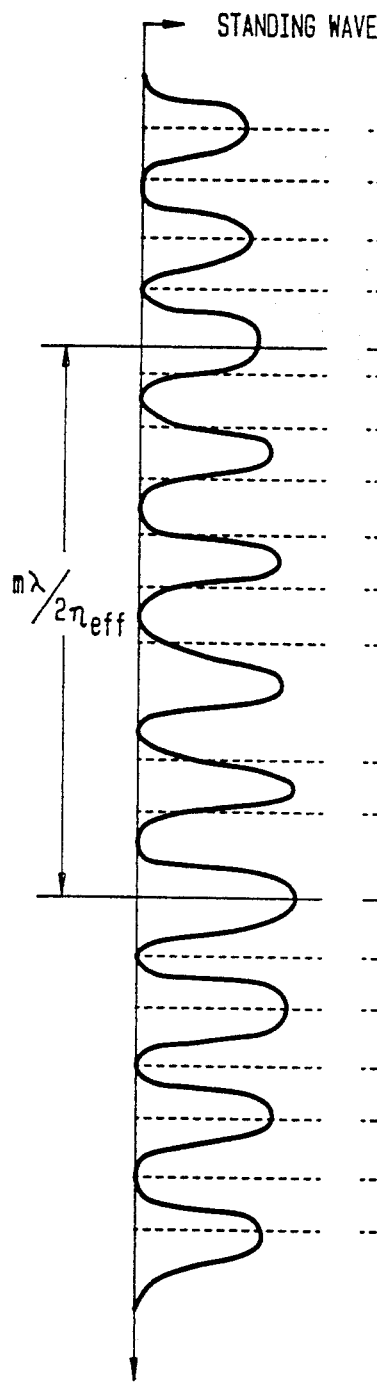
FIG. 5(a) is an enlarged cross-section of a laser cavity shown in FIG. 3.
Figure 5B:
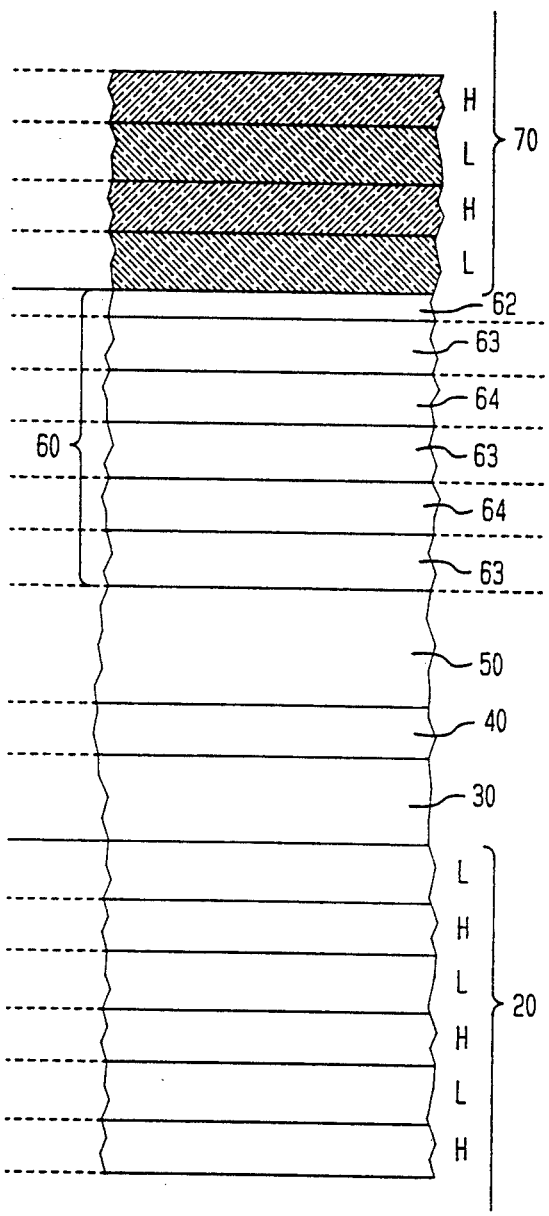
FIG. 5(b) is an illustration of the standing wave intensity with respect to the vertical positions of the layers in the laser cavity shown in FIG. 5(a)

FIG. 5(b) shows the standing wave intensity of the VCSEL with respect to the vertical position in the optical cavity wherein high doped layers 63 are centered at standing wave minima, and low doped layers 64 are centered at standing wave maxima. The standing wave intensity corresponds to the intensity of the light in the optical cavity. Hence, the standing wave maxima are where the light is most intense, whereas the standing wave minima are where the light is least intense. Light is more readily absorbed by high doped materials and less absorbed by low doped materials. Advantageously, by placing the high doped layers at the intensity minima and the low doped layers at the intensity maxima, light absorption in stratified electrode 60 is minimized.

Low doped layer 62 of stratified electrode 60 has a thickness of $\lambda/8n$ so that the interface of the upper mirror and the stratified electrode is located at the standing wave maxima. By properly designing upper spacer 50, active region 40, and lower spacer 30, a laser optical cavity having a length equal to $m\lambda/2n_{eff}$ may be realized, where m is an integer, $\lambda$ is the wavelength of the radiation and $n_{eff}$ is the effective index of refraction of the laser optical cavity.

Figure 5C:
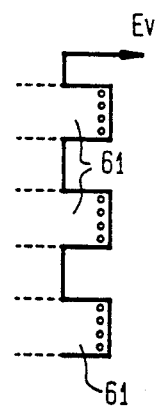
FIG. 5(c) is the bandgap diagram of the layers in the stratified electrode of FIG. 3 with respect to their vertical positions in the optical cavity.

FIG. 5(c) shows a valence band diagram of the layers in stratified electrode 60 with respect to their vertical positions in the laser cavity. Holes 61 from each high doped AlGaAs layer are restricted therein due to the energy barrier present at the AlGaAs/InGaP interface. This results in a higher transverse conductance in the stratified electrode and also prevents the highly concentrated holes in the high doped AlGaAs layers from spilling over to the neighboring areas. Alternatively, GaAs and AlGaAs, GaAs and InGaP, AlGaAs and InGaP, or $Al_xGa_{(1-x)}As$ and $Al_yGa_{(1-y)}As$ where y is a value greater than x, can be utilized as the high and low doped layers, respectively. The use of an intracavity stratified electrode allows a series resistance as low as that in edge emitting laser diodes to be realized without substantially compromising the optical quantum efficiency of the laser.

The uppermost semiconductor structure in FIG. 5(a) can be modified in order to minimize the contact resistance between the top electrical contact and the stratified electrode which is otherwise compromised by the low doping levle of layer 62. It is not desirable for layer 62 to be highly doped inside the laser cavity since it would increase the absorptive loss.

As shown in FIG. 5(d), one way to minimize such contact resistance is to form a shallow p-type implanted region 65 just outside the laser cavity under top electrical contact 80. This would increase the p-type carrier concentration under top electrical contact 80 without compromising the optical quality of the cavity. Forming this shallow implanted area can be easily accomplished through standard photolithography and implantation.

Another way, as shown in FIG. 5(e), is to perform a shallow etch to form a mesa structure consisting of top mirror 70 and the central portion of layer 62. Consquently, top electrical contact 80 is formed on high doped layer 63, thereby reducing the contact resistance. Still another way is to stop the epitaxial growth approximately midway in layer 63 and delete the growth of layer 62. In this case upper mirror 70 must be structured with a high index layer on its bottom in order to produce a cavity resonance at the desired wavelength.

Figure 6:
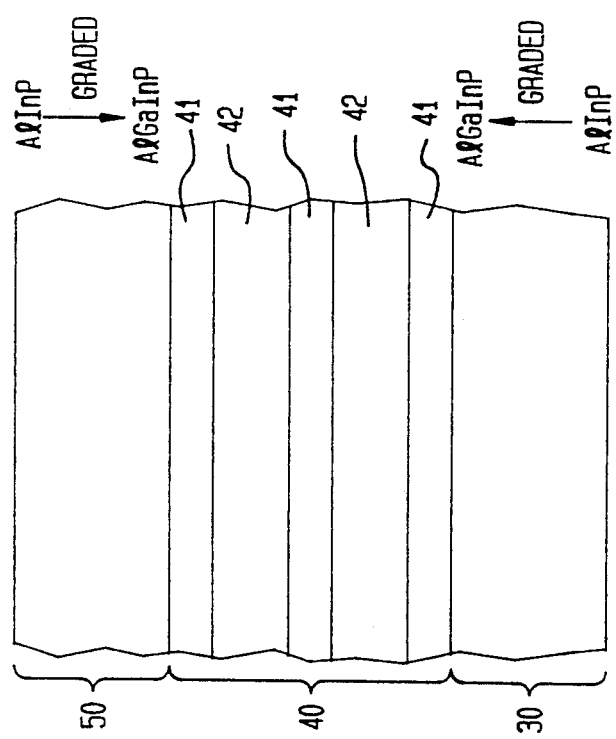
FIG. 6 is a cross-section of the active region and the upper and low spacers of the laser structure shown in FIG. 3.

As shown in FIG. 6, active region 40 comprises three approximately 50 Angstrom thick layers 41 of GaInP separated by two approximately 90 Angstrom thick barrier layers 42 of AlGaInP. The active region is sandwiched by lower spacer 30 and upper spacer 50. Both spacers are undoped AlInP material gradually graded to AlInGaP near the active region. The design and formation of the active region and the spacers are described in detail in our co-pending U.S. Pat. application Ser. No. 07/790,964.

Figure 7:
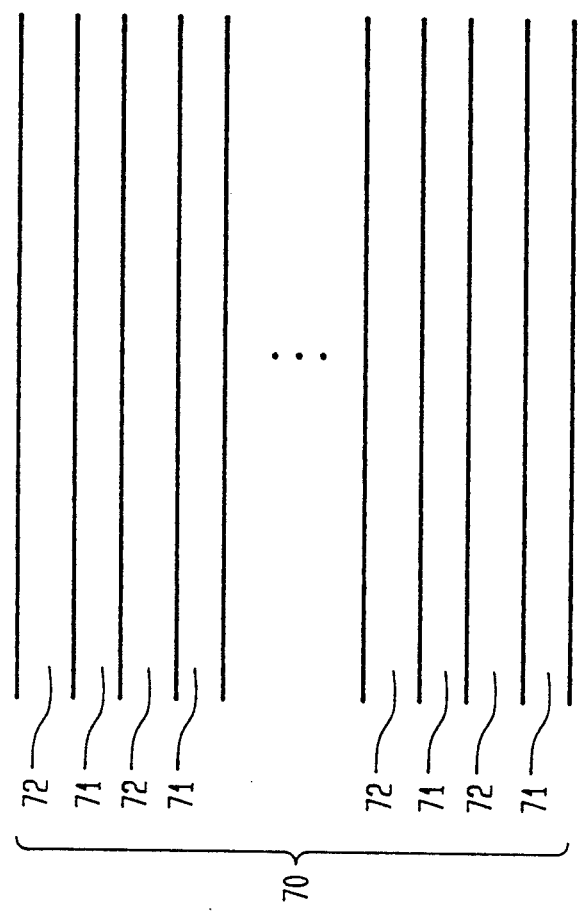
FIG. 7 is enlarged cross-section of an upper dielectric DBR mirror shown in FIG. 3.

As shown in FIG. 7, upper mirror 70 comprises $SiO_2$ layer 71 and $TiO_2$ layer 72, each layer being a $\lambda/4n$ thick where n is the index of refraction. Layers 71 and 72 form a DBR mirror. The relatively large difference in the indices of refraction of $SiO_2$ and $TiO_2$ and, in general, dielectric materials permits fewer layers to be used in forming the upper DBR mirror. Typically, 5 to 6 pairs of these layers are sufficient to provide the high reflectivity needed to achieve lasing in a VCSEL.

Figure 8:
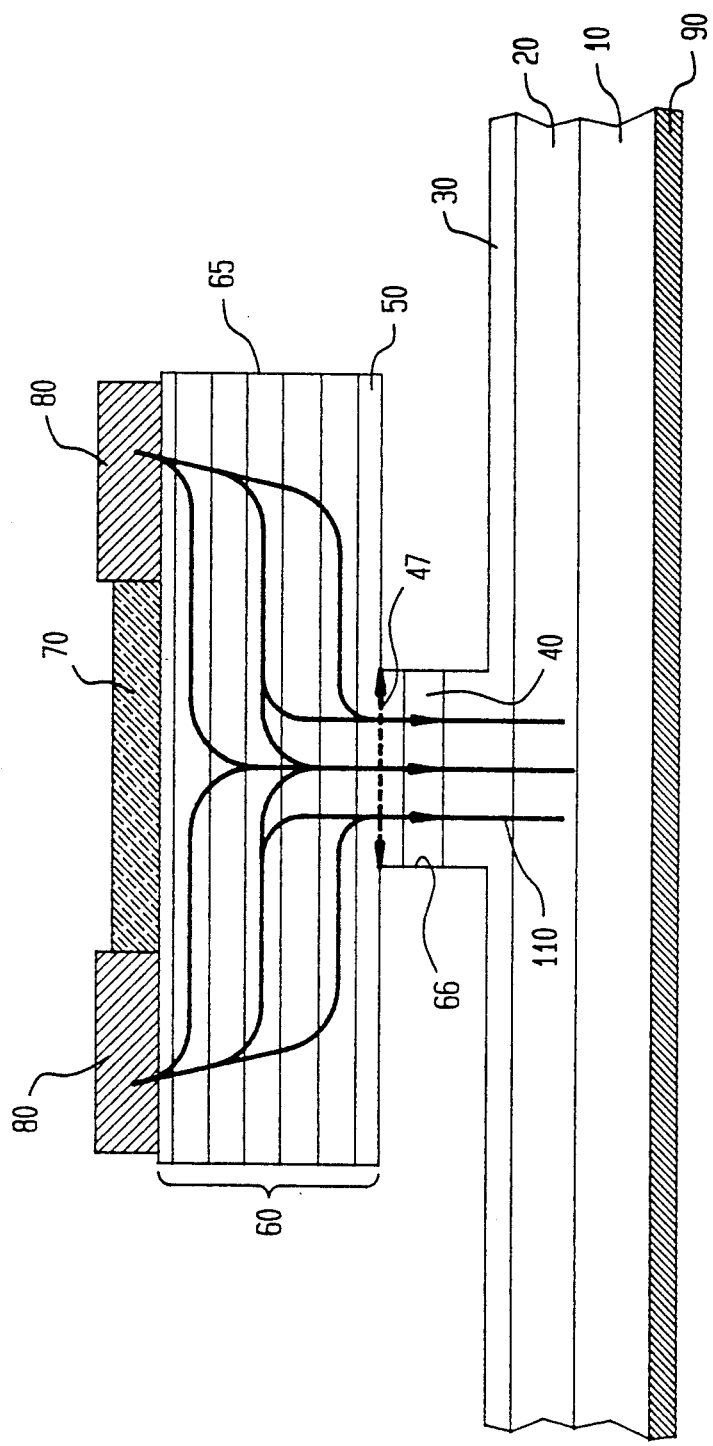
FIG. 8 is a cross-section of a VCSEL with a stratified electrode and an etch defined electrical current aperture.

The preferred embodiments described above utilize an annular proton implanted region 48 to define current aperture 47. Alternatively, as shown in FIG. 8, a vertical mesa etch followed by a selective lateral etch of the active region and surrounding layers can also be used to define the current aperture and isolate the device. Sidewalls 65 and 66 are defined by a vertical mesa etch and a lateral selective etch, respectively.

Other advantages can also be gained in the process of FIG. 8. Since the diameter of the device shown in FIG. 8 is typically between 4–10 μm, the carrier lifetime will be seriously reduced by non-radiative recombination at the periphery of the active region. When this region is defined by ion-implantation, there is no known way to obviate this problem except by a high temperature anneal which might also reduce the effect of the implantation and, hence compromise the structural integrity of the device.

When a mesa is etched to the level of the active material, it is possible for the lateral etch to include a passivation of sidewall 66 of the active material. This passivation preserves the carrier lifetime, reduces the non-radiative recombination and, therefore, results in a lower threshold current and increased optical quantum efficiency.

Figure 9:
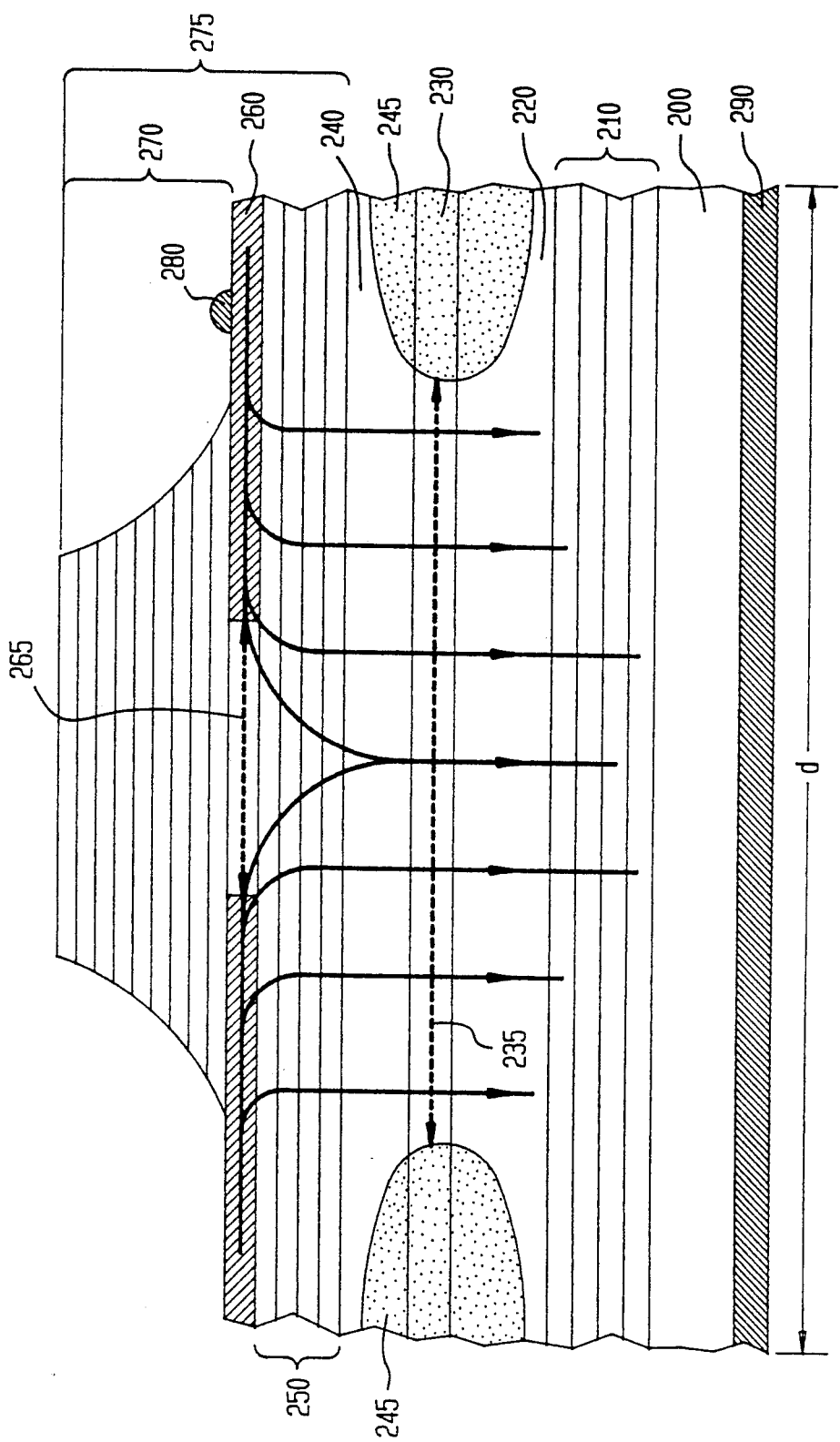
FIG. 9 is a cross-section of a VCSEL having an intra-cavity optical aperture and an optical gain region surrounded by an annular implanted region.

In another embodiment, as shown in FIG. 9, a VCSEL comprises a substrate 200, a lower DBR mirror 210, a lower spacer 220, an active region 230, an upper spacer 240, and an upper DBR mirror 275. A metal layer 260 having an optical aperture 265 is formed within upper mirror 275, thereby dividing upper mirror 275 into two portions; a lower portion 250 and an upper portion 270. This metal layer, perferably consisting of gold beryllium (AuBe), also functions as an ohmic contact layer electrically connected to lower portion 250. Advantageously, lower portion 250 includes only a few pairs of semiconductor DBR layers, resulting in low series resistance. The pairs of semiconductor DBR layers contained in lower portion 250 should be fewer than 10, and the optimum number is dependent on, for example, the specific device geometry, the radiation wavelength λ, and the mirror material.

Although lower portion 250 comprises epitaxially grown semiconductor layers to facilitate electrical contact, upper portion 270 can either be a semiconductor DBR mirror as shown in FIG. 4, a dielectric DBR mirror as shown in FIG. 7, or a combination of both. Details relating to the design and construction of the semiconductor DBR mirrors, dielectric DBR mirrors, spacers, and active region are set forth above and will not be discussed in detail here for the sake of clarity.

An optical gain region 235, having a desired diameter, is defined by an annular shaped proton implanted region 245 in active region 230. Optical aperture 265 is designed to have a diameter smaller than that of the optical gain region and, moreover, is dimensioned so as to restrict the propagation modes of the emitted laser radiation to the $TEM_{00}$ mode in accordance with well known laser radiation theory. Typically, the diameter of optical aperture 265 is between 2 to 7 μm, the diameter of gain region 235 is between 10 to 30 μm, and the device diameter, d, is about 15 μm larger than the optical gain region.

Figure 10:
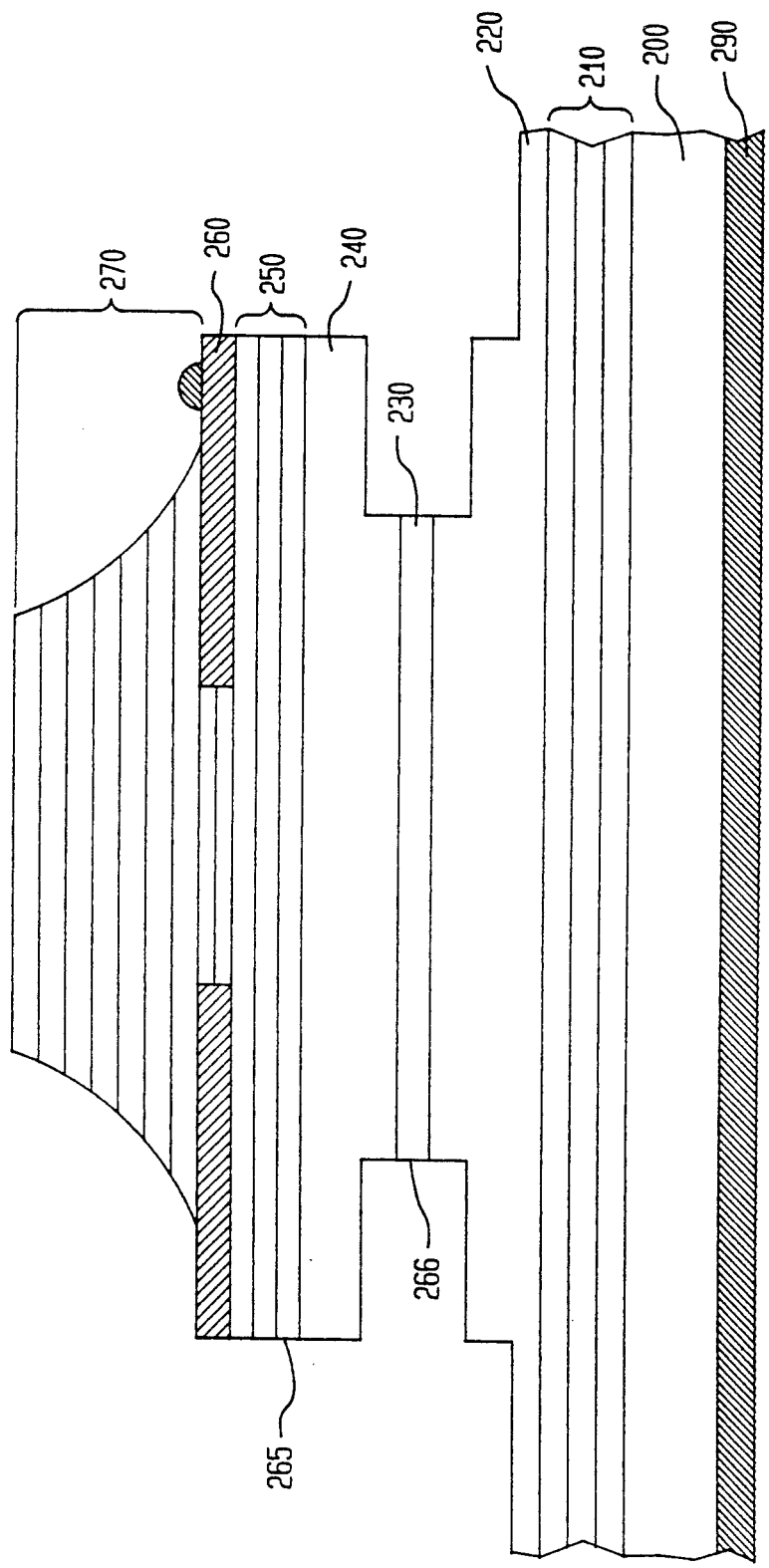
FIG. 10 is a cross-section of a VCSEL with an intra-cavity optical aperture and an etch defined optical gain region.

Various means can be used to define the gain region. For example, FIG. 10 shows the device with an optical gain region which is defined by a vertical mesa etch that reveals sidewall 265, followed by a lateral etching of the active region and the surrounding materials that reveal sidewall 266. Furthermore, active region sidewall 266 can be passivated during or after the lateral etching so as to reduce the non-radiative recombination.

Figure 11:
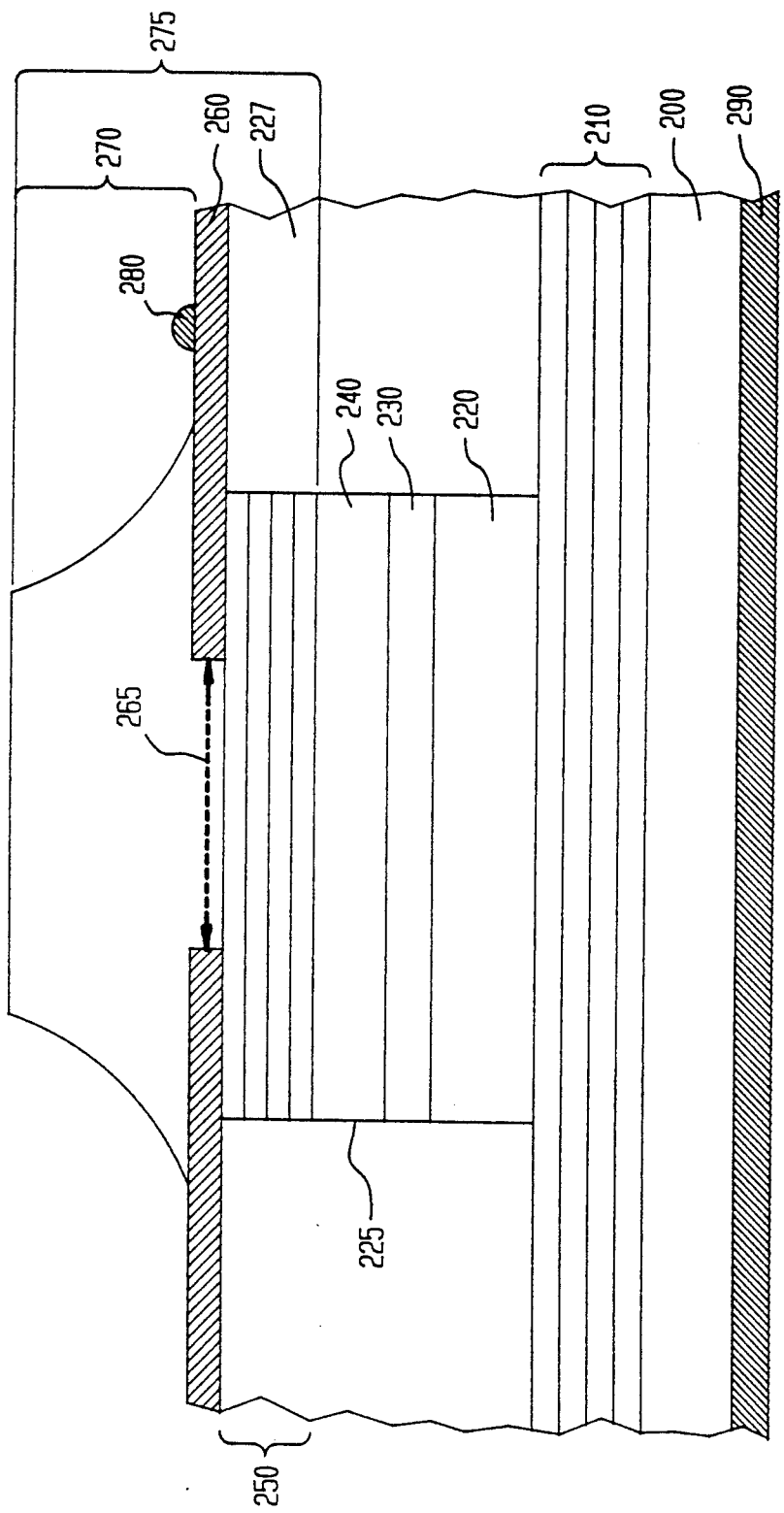
FIG. 11 s a cross-section of a VCSEL with an intra-cavity optical aperture and an optical gain region surrounded by a regrowth material.

As shown in FIG. 11, another means to define the optical gain region is, after vertically etching down the surrounding region below the active region, to vertically regrow around the optical gain region with a material having a high resistivity and lower index of refraction than that of the active region. For example, undoped AlGaAs region 227 may be regrown to surround sidewall 225.

The optical effects of metal layer 260 on the laser cavity can be tailored by varying its thickness and location. By making metal layer 260 about 100 Å thick or less, its optical absorption can be made small. Furthermore, by placing a thin metal layer such as this in an intensity minimum of standing waves, its optical absorption can be negligibly small. The optical absorption effects of metal layer 260 can thus be continuously tuned by varying its thickness, its location, and the diameter of its aperture.

The process for constructing the above structure begins with growing lower mirror 210 on substrate 200, followed by a sequential growth of lower spacer 220, active region 230, upper spacer 240, and first upper mirror portion 250. Then the optical gain region with a desired diameter is defined by etching the surrounding areas vertically down below the active region that results in a mesa structure revealing sidewall 225. Following the etching, AlGaAs is regrown to the same height as the mesa structure so as to form a planar surface. Metal layer 260 is then deposited and optical aperture 265 formed, followed by the deposition of the dielectric layers that form second upper mirror portion 270. Dielectric mirror 270 is then defined and electrical contacts 280 and 290 made to the metal layer and the substrate, respectively.

The above regrowth structure has several advantages over the implanted or lateral etched structures. First, the regrowth structure provides a larger index of refraction step between the active region and the surrounding material than does the implanted structure. Hence, optical radiation is better confined in the regrowth VCSEL structure than in implanted structure, thereby greatly improving the optical quantum efficiency of the laser and allowing smaller diameter lasers to be made.

Secondly, the regrowth planarizes the VCSEL structure and facilitates electrical contact. In free standing lasers formed by etching, due to their small sizes, it is extremely difficult to make electrical contacts to the top portions of the lasers. With the regrowth structures having a planarized surface, electrical contact to the top portion of the laser can easily and reliably be made. Furthermore, regrowth can passivate sidewall damage produced by etching and thus can terminate dangling bonds and quench non-radiative recombination.

Numerous variations in the invention will be apparent to those skilled in the art from the foregoing description. For example, a single stratified electrode can be placed between the lower mirror and the lower spacer in the VCSEL, or the regrowth AlGaAs regions may be replaced with dielectric materials having a lower index of refraction than that of the active region material. Additionally, upper mirror 70 of FIGS. 1, 2, 3 and 8 can be divided into upper and lower portions, above and below stratified electrode, respectively, analogously to the division of upper mirror 275 in FIGS. 9, 10 and 11.

What is claimed is:

1. A vertical-cavity surface-emitting laser that emits radiation at a wavelength, λ, comprising:
   first and second mirrors defining therebetween an optical cavity;
   an active region disposed between said first and second mirrors; and
   a first stratified electrode disposed substantially between said active layer and said first mirror, said first stratified electrode comprising a plurality of alternating high and low doped layers having a first conductivity type for injecting current into said active region to cause lasing, thereby establishing a standing wave in said cavity.

2. The vertical-cavity surface-emitting laser of claim 1 further comprising:
   a first spacer disposed between said active region and said first stratified electrode; and
   a second spacer disposed between said second mirror and said active region.

3. The vertical-cavity surface-emitting laser of claim 1 wherein the optical cavity has a length equal to $m\lambda/2n_{eff}$, where m is an integer, and $n_{eff}$ is the effective index of refraction of the optical cavity.

4. The vertical-cavity surface-emitting laser of claim 1 wherein said low and high doped layers are positioned approximately at the intensity maxima and minima of the standing wave, respectively, so as to reduce radiation absorption in said first stratified electrode.

5. The vertical-cavity surface-emitting laser of claim 1 wherein said high doped layers are each approximately equal to or less than λ/4n thick, and said low doped layers are each approximately equal to or greater than λ/4n thich, where n is the index of refraction of the respective layers.

6. The vertical-cavity surface-emitting laser of claim 1 wherein said high and low doped layers have approximate doping concentrations of $10^{20}/cm^3$ and $10^{18}/cm^3$, respectively.

7. The vertical-cavity surface-emitting laser of claim 1 wherein said high and low doped layers comprise heterostructure semiconductor materials having energy bandgaps suitable to confine the majority carriers from each high doped layer therein.

8. The vertical-cavity surface-emitting laser of claim 7 wherein said high doped layers are $Al_xGa_{(1-x)}As$, and said low doped layers are $Al_xGa_{(1-y)}As$, where x and y are values within the ranges of $0 \leq x \leq 1$, $0 < y \leq 1$, and $x < y$.

9. The vertical-cavity surface-emitting laser of claim 7 wherein said high doped layers are $Al_xGa_{(1-x)}As$ where x is a value in the range of $0 \leq x \leq 1$, and said low doped layers are $In_yAl_zGa_{(1-y-z)}P$ where y and z are values in the ranges of $0 \leq y \leq 1$, $0 \leq z \leq 1$, and $0 \leq (y+z) \leq 1$.

10. The vertical-cavity surface-emitting laser of claim 1 wherein a low doped layer of said first electrode is the layer therein that is closest to said first mirror.

11. The vertical-cavity surface-emitting laser of claim 10 further comprising an annular ion implantation region implanted with conductivity increasing ions to facilitate low resistance electrical contact to said first stratified electrode, said annular ion implantation region including at least the low doped layer of said first electrode that is closest to said first mirror.

12. The Vertical-cavity surface-emitting laser of claim 10 further comprising a mesa, said mesa including at least said first mirror and its closest low doped layer of said first electrode, said mesa exposing an annular area of the high doped layer that is closest to said first mirror for making low resistance electrical contact to said first electrode.

13. The vertical-cavity surface-emitting laser of claim 1 further comprising a second stratified electrode disposed between said second mirror and said active region, said second stratified electrode comprising a plurality of alternately high and low doped layers having a second conductivity type.

14. The vertical-cavity surface-emitting laser of claim 1 further comprising a current aperture for guiding the electrical current flow between said first stratified electrode and said active region, said current aperture including a horizontal disk shaped region located between said first mirror and said active region, said current aperture having an annular surrounding region of lower conductivity so as to cause electrical current to flow largely vertically between said current aperture and said active region to promote $TEM_{00}$ mode lasing.

15. The vertical-cavity surface-emitting laser of claim 14 wherein said first mirror has a diameter equal or greater than that of said current aperture.

16. The vertical-cavity surface-emitting laser of claim 14 wherein said current aperture has a sidewall formed by removing material from the annular surrounding region.

17. The vertical-cavity surface-emitting laser of claim 14 wherein said current aperture is surrounded by an annular region implanted with conductivity reducing ions.

18. The vertical-cavity surface-emitting laser of claim 17 wherein said current aperture is formed within said stratified electrode or a portion thereof.

19. The vertical-cavity surface-emitting laser of claim 17 wherein the annular surrounding region has an implanted ion concentration such that, in the implanted region, the low doped layers of said stratified electrode are resistive, whereas the high doped layers are conductive.

20. The vertical-cavity surface-emitting laser of claim 1 wherein said high doped layers comprise single or multiple quantum wells.

21. The vertical-cavity surface-emitting laser of claim 1 wherein said first stratified electrode is disposed between said active region and entire said first mirror.

22. The Vertical-cavity surface-emitting laser of claim 1 wherein said stratified electrode is disposed within said first mirror.

23. The vertical-cavity surface-emitting laser of claim 1 wherein said first and second mirrors are distributed Bragg reflectors comprising sequential pairs of layers having high and low index of refraction material, each layer having a thickness of $\lambda/4n$ where n is the index of the refraction of the respective layers.

24. A vertical-cavity surface-emitting semiconductor quantum well laser comprising:
   a substrate;
   a first mirror formed on said substrate;
   a first spacer formed on said first mirror;
   an active layer comprising at least one quantum well layer formed on said first spacer, said active layer emitting radiation at a wavelength $\lambda$;
   a second spacer formed on said active layer;
   a stratified electrode formed on said active layer, comprising a plurality of alternating high and low doped layers of the same conductivity type as said second spacer for conducting current to said active layer to cause lasing; and
   a second mirror formed on said stratified electrode, said first and second mirrors defining therebetween a laser cavity having a length equal to $m\lambda/2n_{eff}$, where m is an integer and $n_{eff}$ is the effective index of refraction of the cavity, wherein a standing wave is established, and said low and high doped layers are positioned approximately at the standing wave intensity maxima and minima, respectively, so as to reduce radiation absorption.

25. The laser of claim 24 wherein said first and second mirrors are distributed Bragg reflectors comprising sequential pairs of layers having high and low index of refraction material, each layer having a thickness of $\lambda/4n$ where n is the index of the refraction of the respective layers.

26. The vertical-cavity surface-emitting laser of claim 25 wherein a low doped layer of said first electrode is the layer therein that is closest to said second mirror; and
   wherein a layer having low index of refraction material within said second mirror is the layer therein that is closest to said first stratified electrode.

27. The vertical-cavity surface-emitting laser of claim 25 wherein a high doped layer of said first electrode is the layer therein that is closest to said second mirror; and
   wherein a layer having high index of refraction material within said second mirror is the layer therein that is closest to said first stratified electrode.

28. A vertical-cavity surface-emitting laser comprising:
   a substrate;
   a first mirror formed on said substrate;
   a first spacer formed on said first mirror;
   an active region formed on said first spacer for emitting light at a wavelength, $\lambda$;
   a second spacer formed on said active layer;

a second mirror formed on said second spacer, Wherein said first and second mirrors define therebetween a laser cavity;

an optical gain region having a desired diameter, formed within said active region, said optical gain region having an annular surrounding region of low conductivity; and a metal layer having an optical aperture of a sufficient diameter to suppress higher order transverse mode lasing, said metal layer formed horizontally within or adjacent to said second mirror, said optical aperture being vertically aligned to said optical gain region, and having a diameter equal to or smaller than that of said optical gain region.

29. The vertical-cavity surface-emitting laser of claim 28 wherein said metal layer has a thickness less than 400 Å.

30. The vertical-cavity surface emitting laser of claim 28 wherein said metal layer is positioned approximately at a standing wave intensity minima formed in said laser cavity.

31. The vertical-cavity surface-emitting laser of claim 28 wherein said second mirror comprises distributed Bragg reflectors comprising alternating layers of high and low index of refraction material, each layer having a thickness of $\lambda/4n$ where n is the index of refraction of the layer, and said metal layer dividing said second mirror into upper and lower portions.

32. The vertical-cavity surface-emitting laser of claim 31 wherein said upper portion is disposed above said metal layer, and said upper portion comprises dielectric layers.

33. The vertical-cavity surface-emitting laser of claim 31 wherein said lower portion is disposed below said metal layer, and said lower portion comprises semiconductor layers.

34. The vertical-cavity surface-emitting laser of claim 33 wherein said metal layer is in ohmic contact with the semiconductor layers of said lower portion for conducting electrical current to said active region.

35. The vertical-cavity surface-emitting laser of claim 28 wherein said optical gain region is surrounded by an annular region implanted with conductivity reducing ions.

36. The vertical-cavity surface-emitting laser of claim 28 wherein said optical gain region has a sidewall formed by removing materials from the annular surrounding region.

37. The vertical-cavity surface-emitting laser of claim 28 wherein the annular surrounding region includes regrowth semiconductor material having a high resistivity and a smaller index of refraction than that of said active region.

38. The vertical-cavity surface-emitting laser of claim 28 wherein said metal layer is substantially gold.

* * * * *